US008248850B2

(12) United States Patent
Dutta et al.

(10) Patent No.: US 8,248,850 B2

(45) Date of Patent: Aug. 21, 2012

(54) DATA RECOVERY FOR NON-VOLATILE MEMORY BASED ON COUNT OF DATA STATE-SPECIFIC FAILS

(75) Inventors: Deepanshu Dutta, Santa Clara, CA (US); Jeffrey W. Lutze, San Jose, CA (US); Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 258 days.

(21) Appl. No.: 12/695,918

(22) Filed: Jan. 28, 2010

(65) Prior Publication Data

US 2011/0182121 A1 Jul. 28, 2011

(51) Int. Cl.
*G11C 16/06* (2006.01)
*G11C 7/10* (2006.01)

(52) U.S. Cl. .......... 365/185.09; 365/185.04; 365/185.22

(58) Field of Classification Search ........................ None
See application file for complete search history.

(56) References Cited

U.S. PATENT DOCUMENTS 7,120,051 B2 10/2006 Gorobets et al.
7,206,230 B2 4/2007 Li et al.
7,345,928 B2 3/2008 Li
7,392,436 B2 6/2008 Keays
7,420,847 B2 9/2008 Li
2005/0024948 A1* 2/2005 Kanamitsu et al. ...... 365/189.05
2006/0209609 A1* 9/2006 Kern ............................ 365/218
2007/0153594 A1 7/2007 Chen

OTHER PUBLICATIONS

U.S. Appl. No. 12/616,269, filed Nov. 11, 2009.
International Search Report dated Apr. 1, 2011, International Application No. PCT/US2011/022736.

* cited by examiner

*Primary Examiner* — Hoai V Ho
*Assistant Examiner* — James G Norman
(74) *Attorney, Agent, or Firm* — Vierra Magen Marcus & DeNiro LLP

(57) ABSTRACT

An error detection and data recovery operation for a non-volatile memory system. Even after a programming operation for a set of storage elements is successfully completed, the data of some storage elements may be corrupted. For example, erased state storage element may be disturbed by programming of other storage elements. To allow recovery of data in such situations, associated data latches can be configured to allow the erased state storage elements to be distinguished from other data states once programming is completed. Furthermore, a single read operation can be performed after programming is completed. Logical operations are performed using results from the read operation, and values in the data latches, to identify erased state storage elements which have strayed to another data state. If the number of errors exceeds a threshold, a full recovery operation is initiated in which read operations are performed for the remaining states.

20 Claims, 12 Drawing Sheets

Begin programming operation for upper page of write data, 1200
Configure data latches to identify first subset of storage elements to be kept in E-state, and a second subset of storage elements to be programmed to respective target data states (A, B, C), 1202
Update program loop count, 1204,
Apply Vpgm to selected word line; set inhibit or program mode of storage elements based on data latches, 1206
Perform verify operation using offset and target verify levels, 1208
Update latches based on results from verify operation, 1210
Determine number of under-programmed storage elements, 1212
Number<threshold?, 1214
yes
no
Loop count>max?, 1222
no
yes
Step up Vpgm, 1220
Programming operation successful, 1216
Programming operation unsuccessful, 1224
Perform post-programming error detection and recovery, 1218

199
198
Control circuitry, 110
Power Control, 116
State Machine, 112
On-Chip Address Decoder, 114
Row decoder, 130
Memory array, 155
ADDR
Read/write circuits, 165
Sense Block 1
Sense Block 2
100
Sense Block p
ADDR
Column decoder, 160
Data I/O
118
Controller
150
120
Host bit line
Sense block, 100
Sense module, 180
Bitline Latch, 182
Sense Circuitry, 170
172
Managing circuit, 190
State Machine 112
193
Processor, 192
194
195
196
197
QDL
UDL
LDL
I/O Interface, 196
120
Data 155
BL0 BL1 BL2 BL3 BL4 BL5 BL6 BL7 BL8 BL9 BL10 BL11 BL12 BL13
300
SGD
WL63
WL62
WL3
WL2
WL1
WL0
SGS
310
SGD
WL63
WL62
WL3
WL2
WL1
WL0
SGS
320 of storage elements
600
E
610
B'
Vth
Vvb' of storage elements
602
E
612
B'
Vth
Vvb' of storage elements

602
E
612
604
A
B
606
C
608
Vth
Vra
VvaL
Vva
Vrb
VvbL
Vvb
Vrc
Vvc

Fig. 8a

| | E | A | B | C |
|---|---|---|---|---|
| QDL | 1 | 0 | 0 | 0 |
| UDL | 1 | 0 | 0 | 1 |
| LDL | 1 | 1 | 0 | 0 |

Fig. 8b

| | E | A | B | C |
|---|---|---|---|---|
| QDL | 1 | 1 | 0 | 0 |
| UDL | 1 | 0 | 0 | 1 |
| LDL | 1 | 1 | 0 | 0 |

Fig. 8c

| | E | A | B | C |
|---|---|---|---|---|
| QDL | 1 | 1 | 0 | 0 |
| UDL | 1 | 1 | 0 | 1 |
| LDL | 1 | 1 | 0 | 0 |

Fig. 8d

| | E | A | B | C |
|---|---|---|---|---|
| QDL | 1 | 1 | 1 | 0 |
| UDL | 1 | 1 | 0 | 1 |
| LDL | 1 | 1 | 0 | 0 |

Fig. 8e

| | E | A | B | C |
|---|---|---|---|---|
| QDL | 1 | 1 | 1 | 0 |
| UDL | 1 | 1 | 1 | 1 |
| LDL | 1 | 1 | 1 | 0 |

Fig. 8f

| | E | A | B | C |
|---|---|---|---|---|
| QDL | 1 | 1 | 1 | 1 |
| UDL | 1 | 1 | 1 | 1 |
| LDL | 1 | 1 | 1 | 1 |

| | E | Efail | Afast | Aslow | Ainh | Bfast | Bslow | Binh | Cfast | Cinh | #1 | #2 |
|---|---|---|---|---|---|---|---|---|---|---|---|---|
| QDL | 1 | 1 | 0 | 1 | 1 | 0 | 1 | 1 | 0 | 1 | 0 | 1 |
| UDL | 1 | 1 | 0 | 0 | 1 | 0 | 0 | 1 | 1 | 1 | 1 | 1 |
| LDL | 1 | 1 | 1 | 1 | 1 | 0 | 0 | 1 | 0 | 1 | 1 | 0 |

| | E | Efail | Afast | Aslow | Ainh | Bfast | Bslow | Binh | Cfast | Cinh |
|---|---|---|---|---|---|---|---|---|---|---|
| QDL | 0 | 0 | 0 | 1 | 1 | 0 | 1 | 1 | 0 | 1 |
| UDL | 1 | 1 | 0 | 0 | 1 | 0 | 0 | 1 | 1 | 1 |
| LDL | 1 | 1 | 1 | 1 | 1 | 0 | 0 | 1 | 0 | 1 |

Fig. 11a

| | E | Efail | Afast | Aslow | Ainh | Bfast | Bslow | Binh | Cfast | Cinh |
|---|---|---|---|---|---|---|---|---|---|---|
| QDL | 0 | 0 | 0 | 1 | 1 | 0 | 1 | 1 | 0 | 1 |
| SA<=read@A | 0 | 1 | 1 | 1 | 1 | 1 | 1 | 1 | 1 | 1 |
| SA&~QDL | 0 | 1 | 1 | 0 | 0 | 1 | 0 | 0 | 1 | 0 |

Fig. 11b

| | E | Efail | Afast | Aslow | Ainh | Bfast | Bslow | Binh | Cfast | Cinh |
|---|---|---|---|---|---|---|---|---|---|---|
| QDL | 0 | 0 | 0 | 1 | 1 | 0 | 1 | 1 | 0 | 1 |
| UDL | 1 | 1 | 0 | 0 | 1 | 0 | 0 | 1 | 1 | 1 |
| LDL | 1 | 1 | 1 | 1 | 1 | 0 | 0 | 1 | 0 | 1 |
| SA<=read@A | 0 | 1 | 1 | 1 | 1 | 1 | 1 | 1 | 1 | 1 |
| YBOX | 0 | 1 | 0 | 0 | 0 | 0 | 0 | 0 | 0 | 0 |

YBOX<=SA&~QDL&UDL&LDL

Fig. 11c

| | E | Efail | Afast | Aslow | Ainh | Bfast | Bslow | Binh | Cfast | Cinh |
|---|---|---|---|---|---|---|---|---|---|---|
| QDL | 0 | 0 | 0 | 1 | 1 | 0 | 1 | 1 | 0 | 1 |
| UDL | 1 | 1 | 0 | 0 | 1 | 0 | 0 | 1 | 1 | 1 |
| LDL | 1 | 1 | 1 | 1 | 1 | 0 | 0 | 1 | 0 | 1 |
| QDL* | 0 | 0 | 1 | 1 | 1 | 1 | 1 | 1 | 1 | 1 |
| SA<=read@C | 0 | 0 | 0 | 0 | 0 | 0 | 0 | 0 | X | 1 |
| UDL* | 0 | 0 | 0 | 0 | 0 | 0 | 0 | 0 | 0 | 1 |
| UDL** | 1 | 1 | 0 | 0 | 0 | 0 | 0 | 0 | 1 | 1 |
| SA<=read@B | 0 | 0 | 0 | 0 | 0 | X | 1 | 1 | 1 | 1 |
| LDL* | 1 | 1 | 1 | 1 | 1 | 0 | 0 | 0 | 0 | 0 |

QDL*<=~(~QDL&UDL&LDL)
UDL*<=SA|(UDL&~LDL)
UDL**<=UDL|~QDL
LDL*<=LDL&~SA

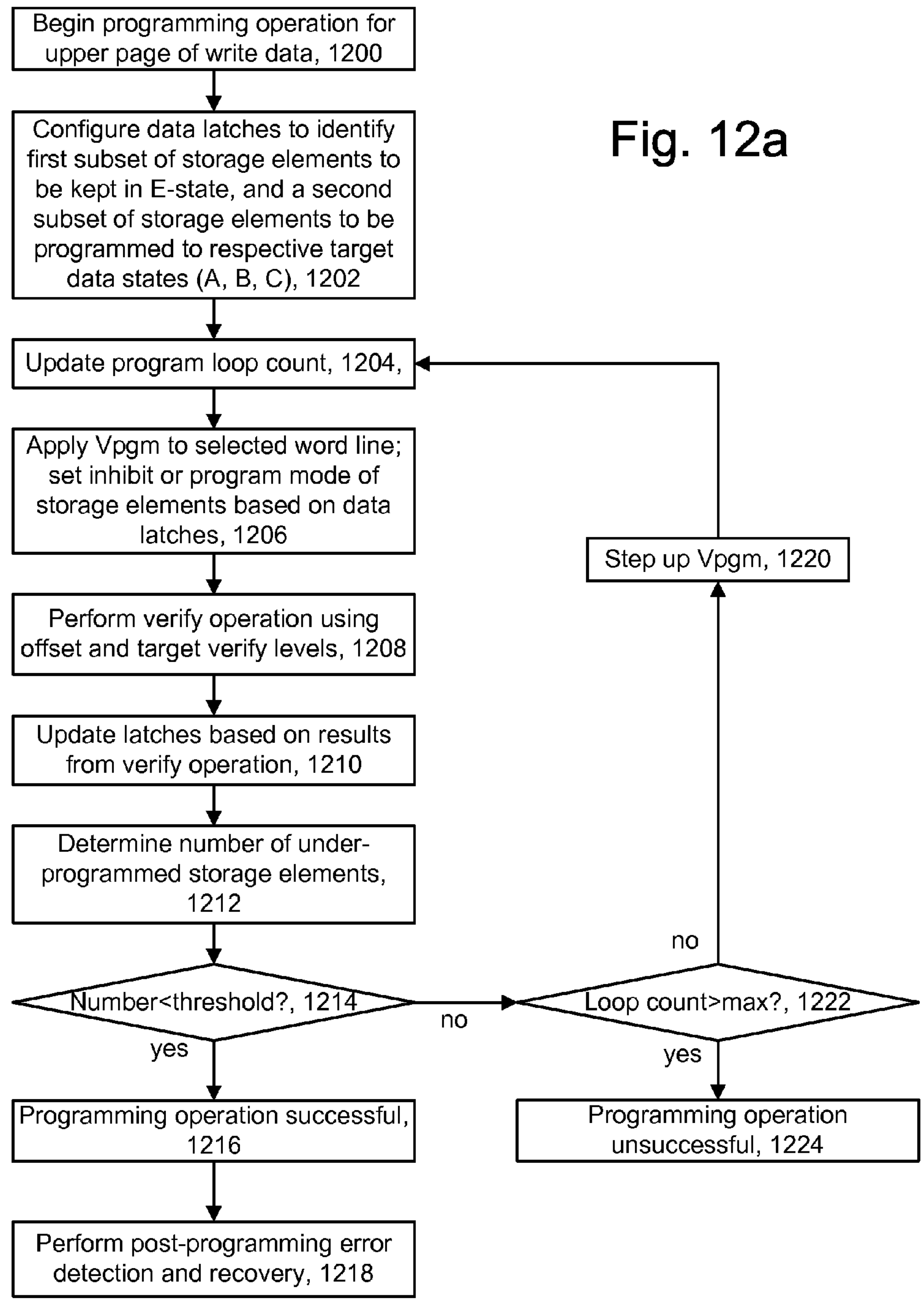
Begin programming operation for upper page of write data, 1200
Configure data latches to identify first subset of storage elements to be kept in E-state, and a second subset of storage elements to be programmed to respective target data states (A, B, C), 1202
Fig. 12a
Update program loop count, 1204,
Apply Vpgm to selected word line; set inhibit or program mode of storage elements based on data latches, 1206
Step up Vpgm, 1220
Perform verify operation using offset and target verify levels, 1208
Update latches based on results from verify operation, 1210
Determine number of under-programmed storage elements, 1212
no
Number<threshold?, 1214
no
Loop count>max?, 1222
yes
yes
Programming operation successful, 1216
Programming operation unsuccessful, 1224
Perform post-programming error detection and recovery, 1218

DATA RECOVERY FOR NON-VOLATILE MEMORY BASED ON COUNT OF DATA STATE-SPECIFIC FAILS

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Of primary importance is the ability to accurately program and read back data from the memory. However, various failure scenarios can result in corrupted data.

BRIEF DESCRIPTION OF THE DRAWINGS

FIGS. 8*a-f* depict example data latch values at different points in a programming operation, for use with the sense block of FIG. 2.

FIG. 11*a* depicts the use of logical operations based on the data latch values of FIG. 10 and results of an A-state read operation to provide a count of erased state errors and under programmed higher state errors in a failure detection process.

FIG. 11*b* depicts the use of logical operations based on the data latch values of FIG. 10 and results of an A-state read operation to provide a count of erased state errors in a failure detection process.

FIG. 11*c* depicts the use of logical operations based on the data latch values of FIG. 10 and results of C- and B-state read operations in a data recovery operation.

FIG. 12*a* depicts an example programming and post-programming failure detection and recovery operation.

DETAILED DESCRIPTION

A method and non-volatile storage system providing error detection and data recovery are provided.

During programming operations, a number of factors can result in corrupted data. For example, there may be a physical defect with a word line or block due to manufacturing process variations. In some cases, the word line is shorted to the substrate, so that boosting is affected and program disturb results. Other potential problems include a short between word lines, varying word line widths, excessive cycling of the block, temperature-related effects and so forth. Moreover, data corruption may go undetected until it is too late to recover the data. For example, based on write data, some storage elements should remain in an erased state while others are programmed to target data states. In this case, an erase state storage element may be disturbed during programming of the other storage elements. A storage element which is programmed to a target data state, above the erased state, can also be disturbed when programming continues for other storage elements, such as to program a same page of data, or another page of data, on the same or different word line.

One approach to detecting data corruption is to read back all of the data after it is programmed and compare it to the original write data. However, this imposes a substantial time penalty and requires additional storage resources such as extra data latches. One solution involves leveraging the existing data latches to detect corrupted data for a particular data state, such as the erased state, which is prone to errors. In this approach, the data latches are configured so that the erased state can be distinguished from the other states when programming of a set of storage elements is completed. By performing a single read operation after the programming operation is successfully completed, accessing the data latches, and performing logical operations, corrupted storage elements can be identified. If the number of corrupted storage elements exceeds a threshold, such as a number of ECC-recoverable errors, a recovery operation can be performed. The recovery operation performs additional read operations and logical operations based on the read results and the data latches, to fully recover the write data.

Figure 1:
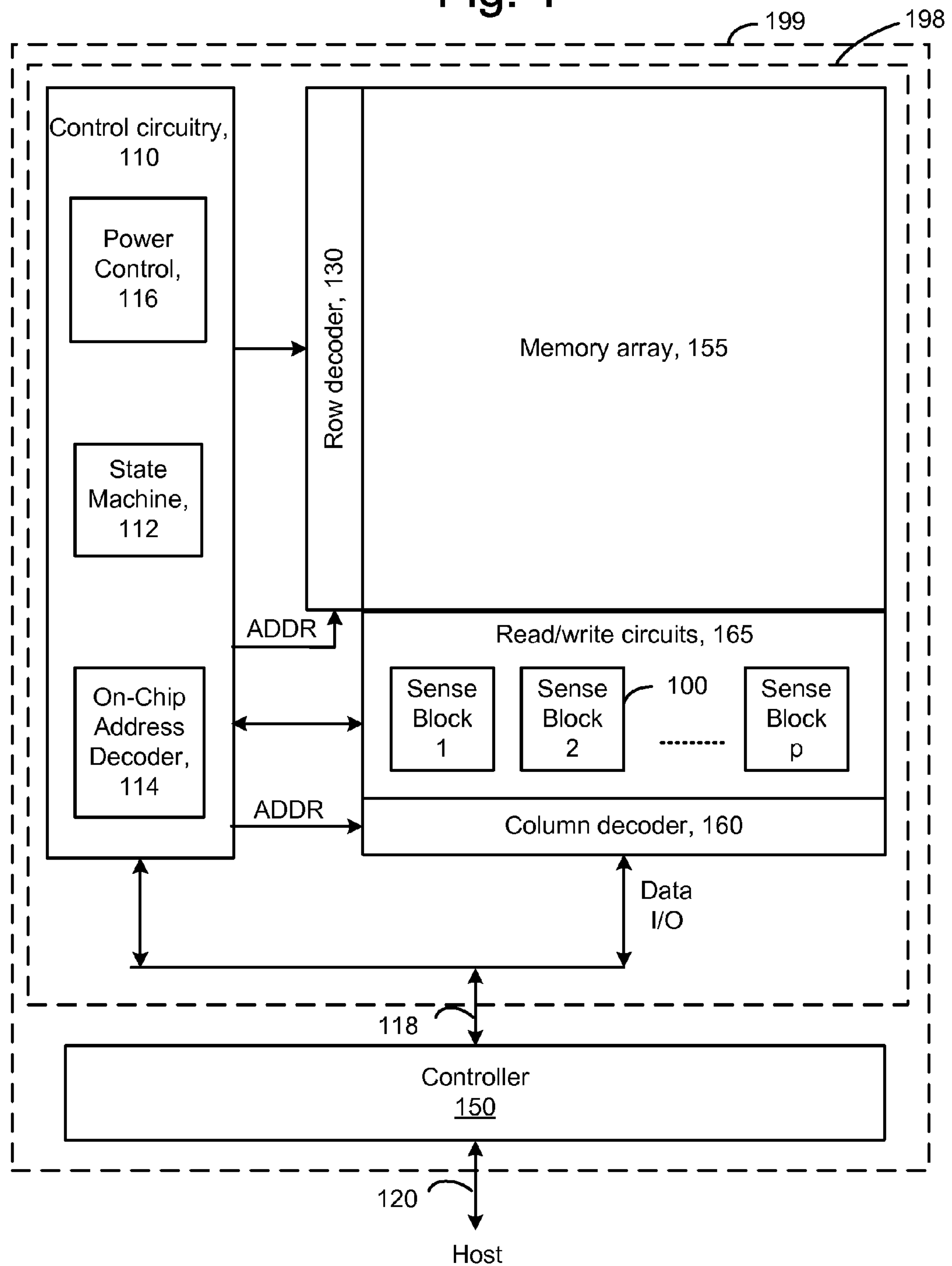
FIG. 1 is a block diagram of a non-volatile memory system using single row/column decoders and read/write circuits.

An example memory system which can be used to provide faster programming and reduced power consumption is discussed next. FIG. 1 is a block diagram of a non-volatile memory system using single row/column decoders and read/write circuits. The diagram illustrates a memory device 199 having read/write circuits for reading and programming a page of storage elements in parallel, according to one embodiment. Memory device 199 may include one or more memory die 198. Memory die 198 includes a two-dimensional memory array of storage elements 155, control circuitry 110, and read/write circuits 165. The memory array 155 is discussed further in connection with FIG. 4.

In some embodiments, the array of storage elements can be three dimensional. The memory array 155 is addressable by word lines via a row decoder 130 and by bit lines via a column decoder 160. The read/write circuits 165 include multiple sense blocks 100 and allow a page of storage elements to be read or programmed in parallel. Typically a controller 150 is included in the same memory device 199 (e.g., a removable storage card) as the one or more memory die 198. Commands and data are transferred between the host and controller 150 via lines 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations.

In some implementations, some of the components of FIG. 1 can be combined. In various designs, one or more of the components (alone or in combination), other than memory array 155, can be thought of as a managing or control circuit. For example, one or more control circuits may include any one of, or a combination of, control circuitry 110, state machine 112, decoders 114/160, power control 116, sense blocks 100 (including the processor 192 in FIG. 2), read/write circuits 165, and controller 150, etc. The sense block 100 is discussed further in connection with FIG. 2.

In another embodiment, a non-volatile memory system uses dual row/column decoders and read/write circuits. Access to the memory array 155 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2:
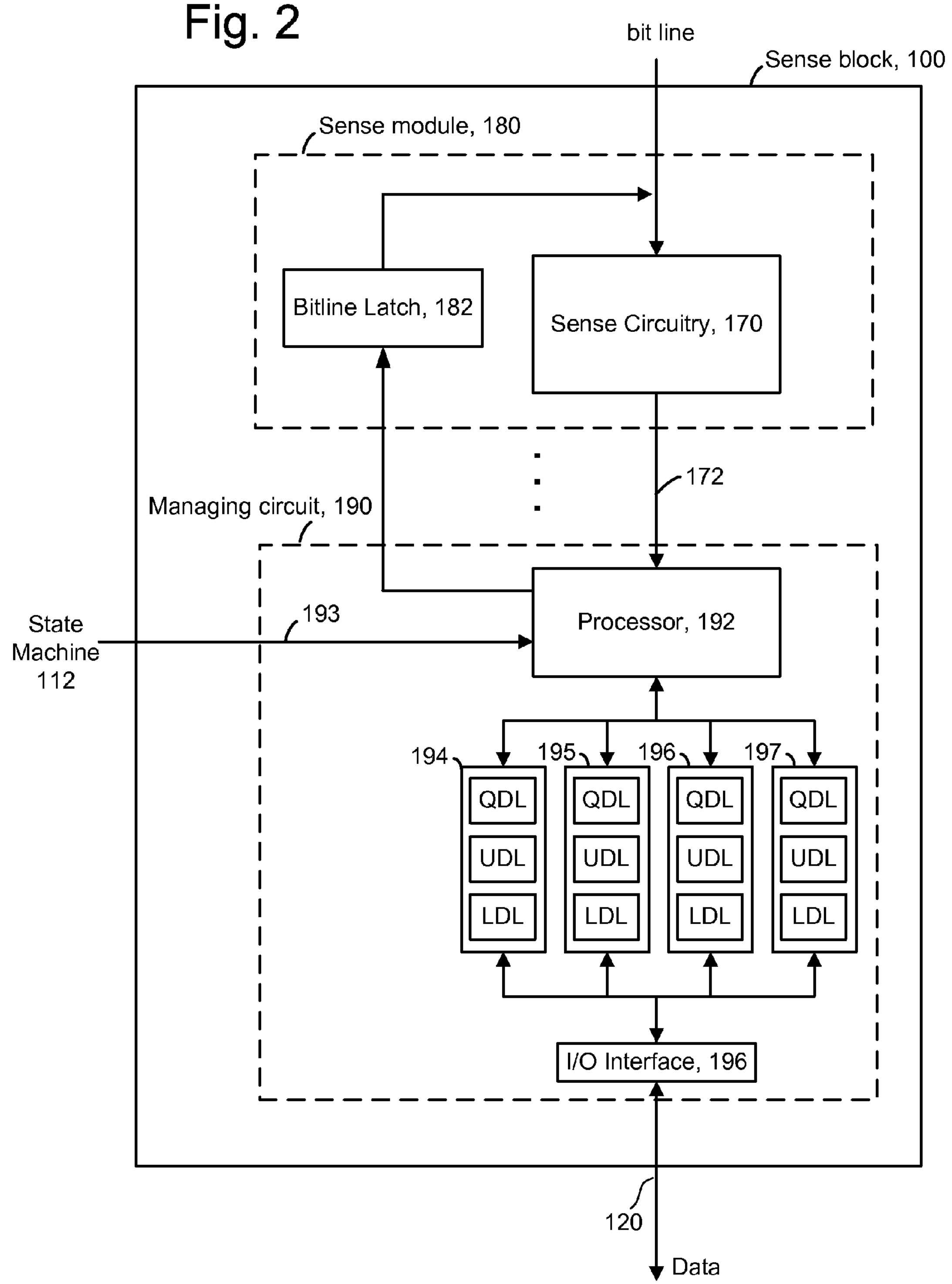
FIG. 2 is a block diagram depicting one embodiment of the sense block 100 of FIG. 1.

FIG. 2 is a block diagram depicting one embodiment of a sense block. An individual sense block 100 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and three data latches identified by QDL, UDL and LDL may be provided for each set. The use of the data latches is discussed further below in particular in connection with FIGS. 8*a*-*f*, 9, 10 and 11*a*-*c*. Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a lower verify level (e.g., VvaL or VvbL in FIG. 5), in a fast programming mode, is above a lower verify level (e.g., VvaL or VvbL) but below a higher or target verify level (e.g., Vva, Vvb or Vvc), in a slow programming mode, or is above the higher or target verify level, in an inhibit mode. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. The UDL latches can be used to store an upper page of data, for instance. A UDL latch is flipped when an upper page bit is stored in an associated storage element. This occurs when an associated storage element completes programming, e.g., when its Vth exceeds a target verify level such as Vva, Vvb or Vvc. The QDL latches can be flipped when an associated storage element is in a slow programming mode.

In some detection schemes, once any storage element is locked out, all the data latches (QDL, LDL, UDL) for that storage element are set to "1". However, this does not allow distinguishing between storage elements which have been locked out at different data states. For example, an E-state storage element cannot be distinguished from an A-, B- or C-state storage element. As discussed further below, the data latches can be used in an optimum way to overcome this problem and thereby implement an efficient error detection and recovery operation.

Figure 3:
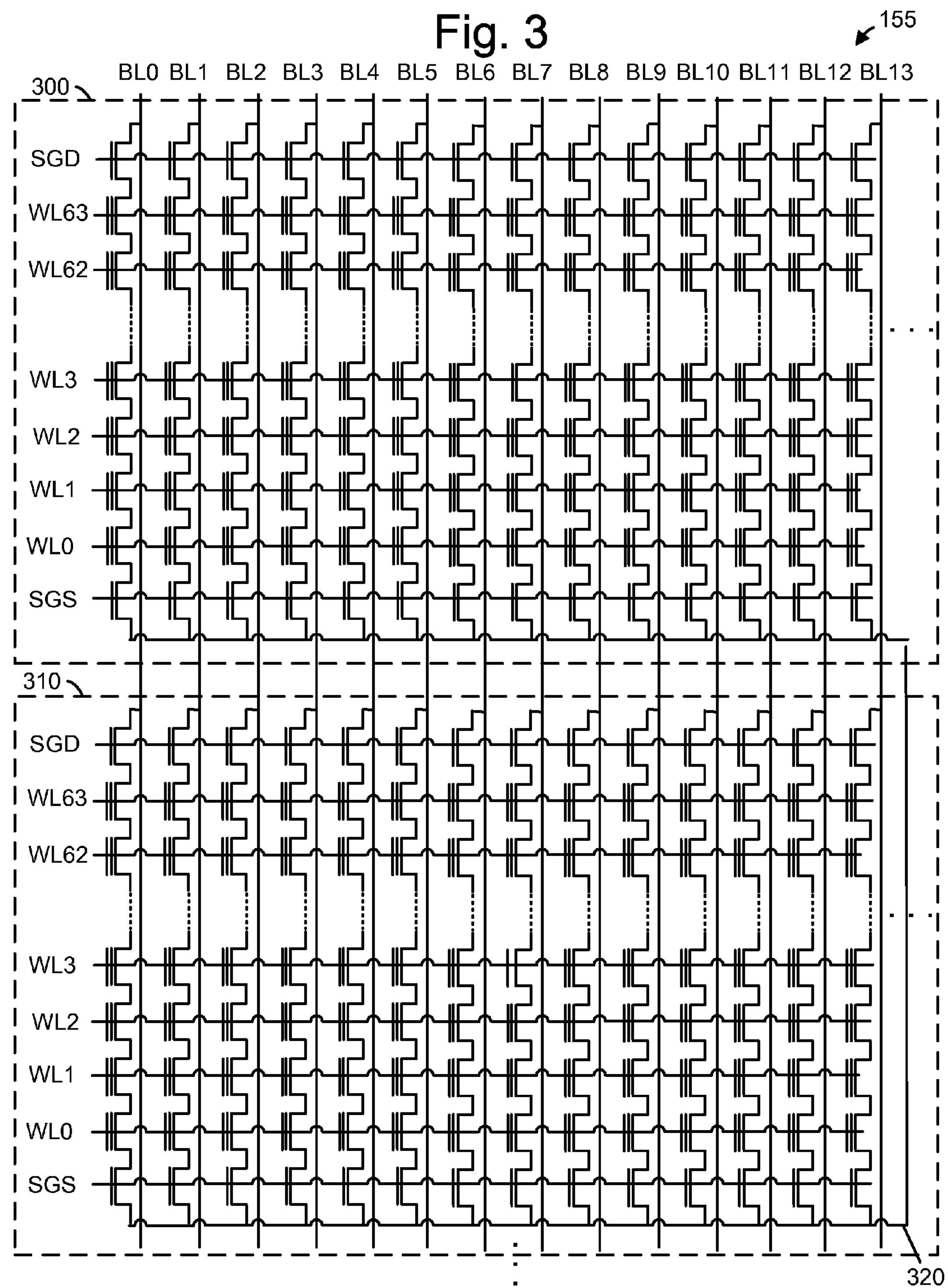
FIG. 3 depicts blocks of NAND flash memory cells in the memory array 155 of FIG. 1.

FIG. 3 depicts blocks of NAND flash memory cells in the memory array 155 of FIG. 1. The memory array can include many blocks. Each example block 300, 310 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 320. Sixty-four word lines, for example, WL0-WL63, extend between the source select gates and the drain select gates.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 4:
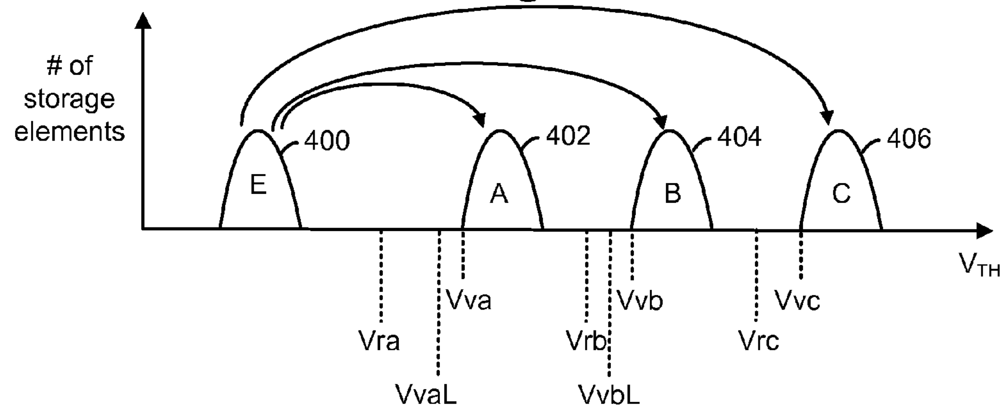
FIG. 4 depicts an example threshold voltage distribution and one-pass programming.

FIG. 4 depicts an example threshold voltage distribution and one-pass programming. Example threshold voltage distributions for the storage element array are provided for a case where each storage element stores two bits of data. A first threshold voltage distribution 400 is provided for erased (E-state) storage elements. Three threshold voltage distributions 402, 404 and 406 represent programmed states A, B and C, respectively. In one embodiment, the threshold voltages in the E-state distribution are negative and the threshold voltages in the A-, B- and C-state distributions are positive.

The number of storage elements which are in a particular state can be determined by maintaining a count of storage elements whose threshold voltage is determined to exceed the corresponding verify level.

Each distinct threshold voltage range corresponds to predetermined values for the set of data bits. The specific relationship between the data programmed into the storage element and the threshold voltage levels of the storage element depends upon the data encoding scheme adopted for the storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the other multi-state structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three target verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

Figure 13:
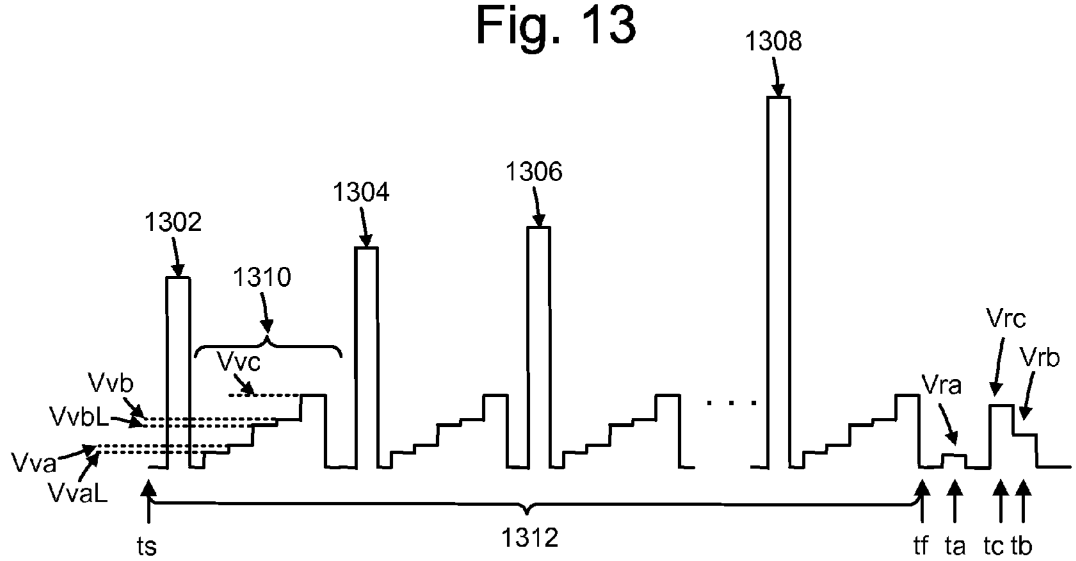
FIG. 13 depicts an example waveform of a selected word line in a programming operation and subsequent data recovery operation.

In one embodiment, known as full sequence programming, storage elements can be programmed from the E-state directly to any of the programmed states A, B or C. For example, a population of storage elements to be programmed may first be erased so that all storage elements in the population are in erased state E. A series of program pulses such as depicted in FIG. 13 will then be used to program storage elements directly into states A, B or C. While some storage elements are being programmed from state E to state A, other storage elements are being programmed from state E to state B and/or from state E to state C.

Moreover, offset and target verify levels are used for one or more data states. For example, VvaL and Vva are offset and target verify levels, respectively, for the A-state, and VvbL and Vvb are offset and target verify levels, respectively, for the B-state. An offset verify level is offset from a final or target verify level. An offset verify level could possibly be higher than the target verify level depending on the programming scheme. The verify level can represent a voltage or a current.

During programming, when the Vth of an A-state storage element (which is intended to be programmed to the A-state as a target state) is less than or equal to VvaL, the storage element is programmed in a fast programming mode. This may be achieved by grounding the bit line. When Vva≧Vth>VvaL, the storage element is programmed in a slow programming mode, such as by raising the associated bit line voltage to a level which is between ground and a full inhibit level. This provides greater accuracy and thus a narrower Vt distribution by avoiding large step increases in threshold voltage. When Vth>Vva, the storage element is locked out from further programming. Similarly, a B-state storage element (which is intended to be programmed to the B-state) can have fast and slow programming modes. Note that, in one approach, a slow programming mode is not used for the highest state, such as the C-state, as it is less beneficial than with other states.

In an example of eight-state programming, with an erased state and seven programmed states A-G, fast and slow programming modes could be used for the intermediate states A-F, for instance.

Figure 5:
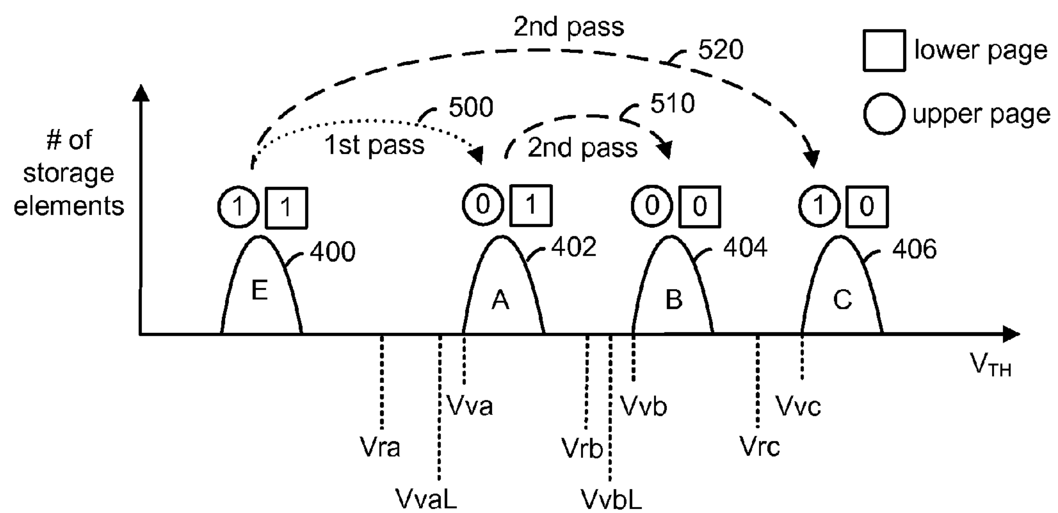
FIG. 5 depicts an example threshold voltage distribution and two-pass programming.

FIG. 5 illustrates an example of a two-pass technique of programming a multi-state storage element that stores data for two different pages: a lower page and an upper page. Four states are depicted by repeating the threshold voltage distributions 400, 402, 404 and 406 from FIG. 4. These states, and the bits they represent, are: state E (11), state A (01), state B (00) and state C (10). For state E, both pages store a "1." For state A, the lower page stores a "1" and the upper page stores a "0." For state B, both pages store "0." For state C, the lower page stores "0" and the upper page stores "1." Note that although specific bit patterns have been assigned to each of the states, different bit patterns may also be assigned.

In a first programming pass, the storage element's Vth is set according to the bit to be programmed into the lower logical page. If that bit is a logic "1," the Vth is not changed since it is in the appropriate state as a result of having been earlier erased. However, if the bit to be programmed is a logic "1," the Vth is increased to be state A, as shown by arrow 500. That concludes the first programming pass.

In a second programming pass, the storage element's Vth is set according to the bit being programmed into the upper logical page. With the lower, upper pages being 1,1, then no programming occurs since the storage element is in state E. With the lower, upper pages being 0,1, then no programming occurs since the storage element is in state A. With the lower, upper pages being 0, 0, a transition from state A to state B, represented by arrow 510, occurs. With the lower, upper pages being 1, 0, a transition from state E to state C, represented by arrow 520, occurs.

Offset verify levels VvaL and VvbL can be used as well for the A- and B-states, respectively, in this example.

In one embodiment, a system can be set up to perform full sequence writing if both lower and upper page data is available. If enough data is not available, then the programming operation can program the lower page data with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements.

Figure 6A:
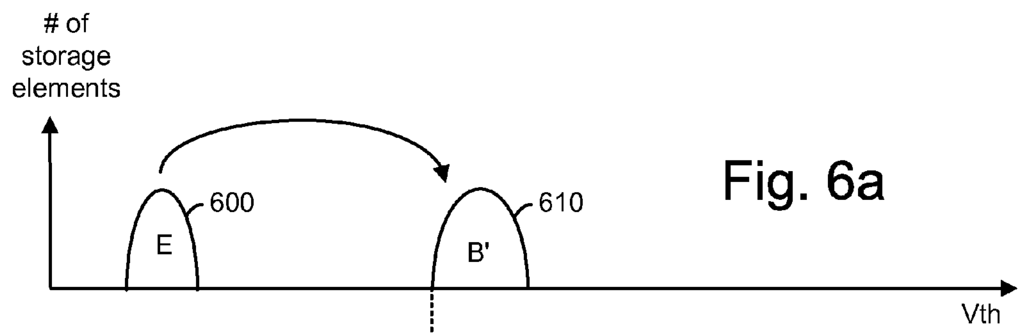
FIGS. 6*a-c* depicts an example threshold voltage distribution and two-pass programming using an intermediate state.
Figure 6B:
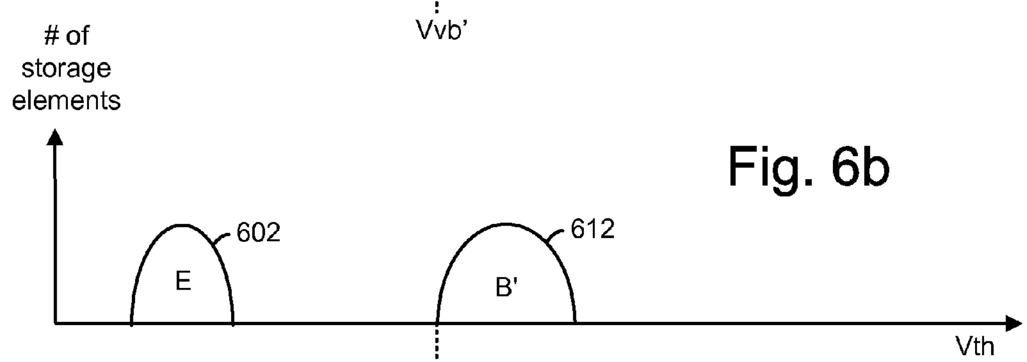
Figure 6C:
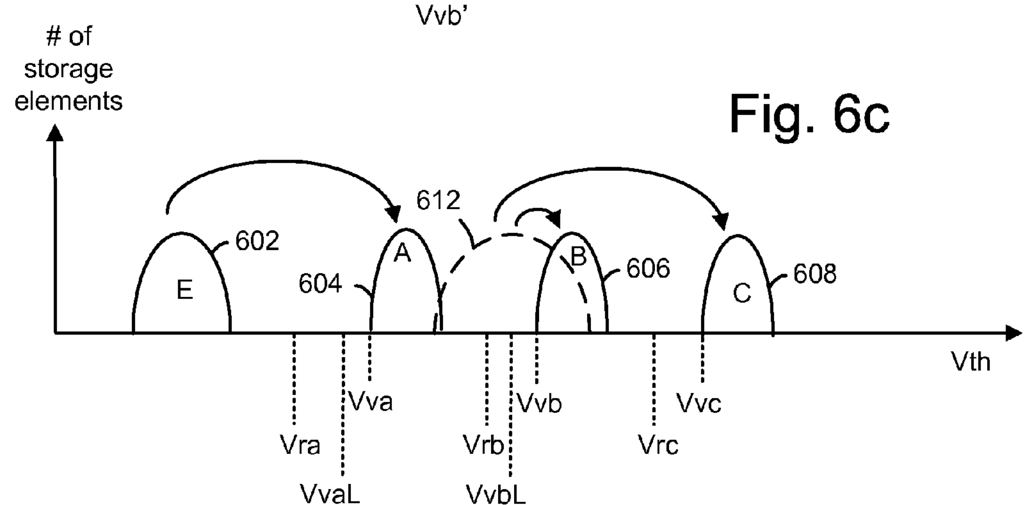

FIGS. 6*a-c* depicts an example set of threshold voltage distributions and two-pass programming using an intermediate state. This programming technique reduces the effect of floating gate-to-floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, the E-state is the erased state and states A, B and C are the programmed states. As before, state E stores data 11, state A stores data 01, state B stores data 00 and state C stores data 10. Other encodings of data to physical data states can also be used. Each storage element stores two pages of data. For reference purposes, these pages of data will be called upper page and lower page; however, they can be given other labels.

The programming operation is a two-step process. In the first step, the lower page is programmed. If the lower page is to remain data 1, then the storage element state remains at state E (distribution 600). If the data is to be programmed to 0, then the threshold of voltage of the storage element is raised such that the storage element is programmed to state B' (distribution 610). FIG. 6*a* therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. This will have the effect of widening the threshold voltage distribution for state B' to that depicted as threshold voltage distribution 612 of FIG. 6*b*. This apparent widening of the threshold voltage distribution will be remedied when programming the upper page. The E state will also be widened as depicted by distribution 602.

FIG. 6*c* depicts the process of programming the upper page. If the storage element is in erased state E and the upper page is 1, then the storage element will remain in state E (distribution 602). If the storage element is in state E and its upper page data is 0, then the threshold voltage of the storage element will be raised so that the storage element is in state A (distribution 604). If the storage element was in intermediate threshold voltage distribution 612 and the upper page data is to 0, then the storage element will be programmed to final state B (distribution 606). If the storage element is in intermediate threshold voltage distribution 612 and the upper page data is 1, then the threshold voltage of the storage element will be raised so that the storage element is in state C (distribution 608). Offset verify levels can be used as well for the A and B data states, in this example. The process depicted by FIGS.

*6a-c* reduces the effect of floating gate to floating gate coupling because only the upper page programming of neighbor storage elements will have an effect on the apparent threshold voltage of a given storage element. An example of an alternate state coding is to move from distribution 612 to state C when the upper page data is a 0, and to move to state B when the upper page data is a 1.

Although FIGS. *6a-c* provide an example with respect to four data states and two pages of data, the concepts taught can be applied to other implementations with more or fewer than four states and more or less than two pages. For example, memory devices with eight or sixteen states per storage element are currently planned or in production.

Figure 7:
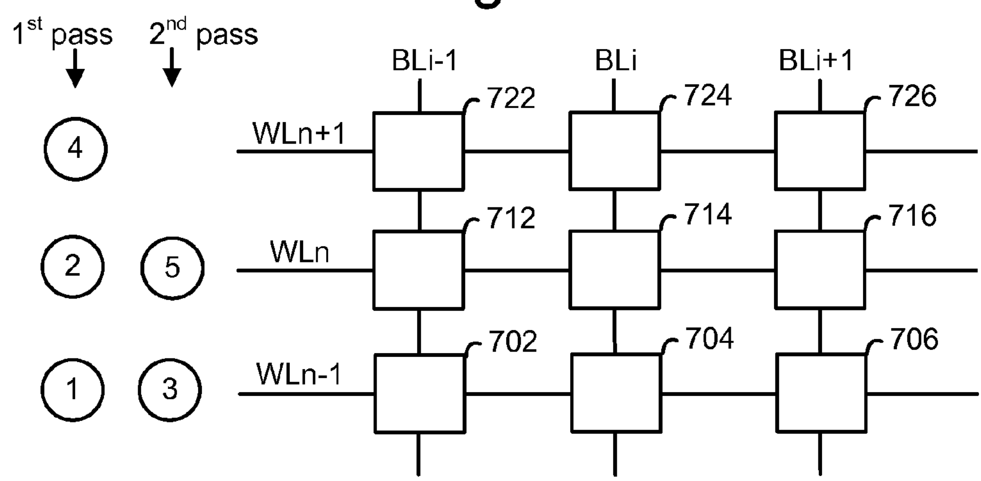
FIG. 7 depicts a multi-pass program operation for a set of storage elements in a back-and-forth word line order.

FIG. 7 depicts a multi-pass program operation for a set of storage elements in a back-and-forth word line order. The components depicted may be a subset of a much larger set of storage elements, word lines and bit lines. In one possible program operation, storage elements on WLn−1, e.g., storage elements 702, 704 and 706, are programmed in a first programming pass. This step is represented by the circled "1." Next ("2"), storage elements on WLn, e.g., storage elements 712, 714 and 716, are programmed in a first programming pass. In this example, when a word line is selected for programming, verify operations occur after each program pulse. During the verify operations on WLn, one or more verify voltages are applied to WLn and pass voltages are applied to the remaining word lines including WLn−1 and WLn+1. The pass voltages are used to turn on (make conductive) the unselected storage elements so that a sensing operation can occur for the selected word line. Next ("3"), storage elements on WLn−1 are programmed in a second programming pass. Next ("4"), storage elements on WLn+1 are programmed in a first programming pass. Next ("5"), the storage elements on WLn are programmed in a second programming pass to their final respective states.

Due to the programming on WLn+1, the storage elements on WLn are affected by coupling which tends to raise and widen their threshold voltage distribution for each state. This can occur during both single-pass and multi-pass programming. In single-pass pass programming, each word line is programmed completely before moving to the next word line, e.g., WLn−1, then WLn, then WLn+1.

FIGS. *8a-f* depict example data latch values at different points in a programming operation for use with the sense block of FIG. 2. In this example, each bit line is associated with three data latches namely QDL, UDL and LDL. The data latches can be considered to be first, second and third data latches, respectively. Each bit line and selected storage element may have first, second and third data latches. The first data latch of one bit line corresponds to the first data latch of another bit line, e.g., both can be QDL. The second data latch of one bit line corresponds to the second data latch of another bit line, e.g., both can be UDL. The third data latch of one bit line corresponds to the third data latch of another bit line, e.g., both can be LDL. UDL and LDL store the bit information for upper page and lower pages, respectively, while QDL stores the information about whether or not a storage element has passed the lower verify level.

FIG. *8a* depicts the bit values for each set of data latches at the start of programming according to the target data state of the associated storage element. For an E-state storage element, all latches are set to 1. For an A-state storage element, the QDL, UDL and LDL latches are set to 0, 0 and 1, respectively. For a B-state storage element, all latches are set to 0. For a C-state storage element, the QDL, UDL and LDL latches are set to 0, 1 and 0, respectively.

FIG. *8b* depicts the bit values for each data latch according to the target data state of the associated storage element after the Vth of an A-state storage element has passed the lower verify level, VvaL. The QDL bit is flipped to 1 as indicated by the dashed-line box. The changes in the data latches are made at the end of each program-verify iteration, after verify operations are performed.

FIG. *8c* depicts the bit values for each latch according to the target data state of the associated storage element after the Vth of an A-state storage element has passed the target verify level, Vva. The UDL bit is flipped to 0 as indicated by the dashed-line box.

FIG. *8d* depicts the bit values for each latch according to the target data state of the associated storage element after the Vth of a B-state storage element has passed the lower verify level VvbL. The QDL bit is flipped to 1 as indicated by the dashed-line box.

FIG. *8e* depicts the bit values for each latch according to the target data state of the associated storage element after the Vth of a B-state storage element has passed the target verify level Vvb. The UDL and LDL bits are flipped to 1 as indicated by the dashed-line box.

FIG. *8f* depicts the bit values for each latch according to the target data state of the associated storage element after the Vth of a C-state storage element has passed the target verify level Vvc. The QDL and LDL bits are flipped to 1 as indicated by the dashed-line boxes.

Figures 9, 10:
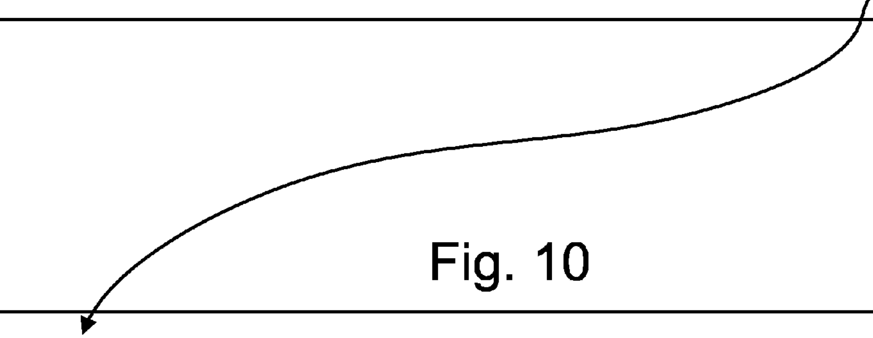
FIG. 9 depicts the data latch values of FIGS. 8*a*-8*f* according to a fast, slow or inhibit mode of a storage element, for different data states, in addition to two unused data latch combinations.
FIG. 10 depicts a modification of the data latch values of FIG. 9, so that the erased state has a different combination than the inhibited A-, B- and C-states.

FIG. 9 depicts the data latch values of FIGS. *8a-8f* according to a fast, slow or inhibit mode of a storage element, for different data states, in addition to two unused data latch combinations. As mentioned, a storage element can be programming in a fast programming mode until the offset verify level of its target data state is reached, after which the storage element is programming in a slow programming mode until the target verify level of the target data state is reached, after which the storage element is inhibited from further programming. The data latches provided herein include different three-bit combinations for different programming modes, and for different data states.

"E" represents an E-state storage element which remains in the E-state, so that no failure occurs. "Efail" represents an E-state storage element which is disturbed so that it rises above the E-state, so that a failure occurs. Both situations are represented by the same data latch values because they were both intended to be E-state storage elements according to the write data. "Afast," "Aslow" and Ainhibit ("Ainh") represent the fast, slow and inhibited modes, respectively, for an A-state storage element. Similarly, "Bfast," "Bslow" and Binhibit ("Binh") represent the fast, slow and inhibited modes, respectively, for a B-state storage element. "Cfast" and Cinhibit ("Cinh") represent the fast and inhibited modes, respectively, for C-state storage elements. The A-, B- and C-state storage elements have QDL=UDL=LDL=1 at the end of a programming operation, so that they cannot be distinguished from one another by their data latches. Similarly, with this implementation, the E-state storage elements cannot be distinguished from the A-, B- and C-state storage elements at the end of the programming operation.

A solution to this problem can be found by realizing that, since there are three data latches, there are $2^3=8$ possible unique combinations of the triplet (QDL, UDL, LDL). However, in this example, the storage elements can be characterized by only six categories: E-state, above E-state but below VvaL, between VvaL and Vva, above Vva but below VvbL, between VvbL and Vvb, and above Vvb but below Vvc. Thus, two of the combinations are unused: namely #1 (0, 1, 1) and #2 (1, 1, 0).

These combinations can be used for error detection and data recovery purposes. Combination #1 has the advantage that the UDL and LDL data for this combination is same as that for a regular E state storage element, i.e., UDL=1 and LDL=1, which means the upper page and lower page bit information for an E state storage element remain unchanged. For this configuration, QDL=0 is used, whereas QDL=1 is used to represent the inhibited A-, B- and C-state storage elements. This allows an E-state storage element to be distinguished from the A-, B- and C-state storage elements at the end of a programming operation.

FIG. 10 depicts a modification of the data latch values of FIG. 9, so that the erased state has a different combination than the inhibited A-, B- and C-states. Here, QDL=0, UDL=1 and LDL=1 for the "E" and "Efail" storage elements. The same combinations as provided in FIG. 9 can be maintained for the other data states, and are repeated in FIG. 10. At the end of a programming operation, all the E-state storage element have data latches (0, 1, 1,), while the A-, B- and C-state storage elements which have been inhibited have data latches of (1, 1, 1). Thus, at the end of programming, a scan of QDL can distinguish between an E-state storage element and other storage elements.

The E-state storage elements can be considered to be in a first subset of storage elements in a larger set of storage elements, such as on a word line, and the A-, B- and C-state storage elements can be considered to be in a second subset of the set. The various storage elements of different states can be randomly distributed and intermixed. The storage elements in the second subset are to be programmed to at least three target data states, including a first target data state (A-state) which is adjacent to the E-state, a second target data state (B-state) adjacent to the first target data state, and a third target data state (C-state) adjacent to the second target data state. Each storage element in the second subset which has successfully completed programming has a first value (e.g., 1) in one of its associated data latches (e.g., QDL), and each storage element in the first subset is identified by a value (e.g., 0) which is different than the first value in one of its associated data latches (e.g., QDL).

This revised data latch configuration can be used to determine the number of E-state failures, referred to as E→X fails, because the storage element transitions to a higher state X, typically the A-state. At the end of a programming operation, a read operation can be performed using Vra (or other voltage between the E- and A-state distributions) to identify storage elements for which Vth>Vra. These storage elements will be non-conductive during sensing. Based on the result of the read operation and the QDL values, the number of E→X failures can be counted. If the number of failures in a page of storage elements is higher than a threshold, referred to as bit ignore threshold (e.g., set by a ROM fuse parameter in the memory device), then a program status=fail can be set on that page. The data on that page can be recovered by a recovery operation which involves performing a full read operation which comprises a C-state read at Vrc (or other voltage between the B- and C-state distributions) and then a B-state read at Vrb (or other voltage between the A- and B-state distributions). The recovery operation also uses the A-state read results which are already available from the error detection process, and accessing the data latch values and performing appropriate logical operations, as discussed next.

Note that this data latch assignment of FIG. 10 will affect the program data transfer which indicates whether fast or slow programming mode is active. For comparison, the approach of FIG. 9 decides whether a fast or slow programming mode is active by only looking at QDL (using SA<=QDL), and sets a bit line bias accordingly (Vbl is raised for the slow programming mode, and grounded for the fast programming mode). Here "SA<=QDL" indicates that data is loaded from QDL into SA. With the approach of FIG. 10, it is possible that a bias "0" overwrites program inhibit information. To avoid this, the new program data transfer can be changed to: SA<=QDL|(UDL&LDL) where "|" represents a logical OR operation.

With the approach of FIG. 10, at the end of the programming operation, the under-programmed A-, B- and C-state storage elements can be counted to see if the total number is less than a threshold. This can be accomplished by performing a logical operation YBOX<=UDL&LDL, which loads a temporary variable YBOX with the value UDL&LDL, where "&" represents a logical AND, and counting the number of 0's in YBOX. The logical operations can be performed by, and YBOX can be maintained in, the managing circuit for the sense modules, the state machine or other location One similarity between the approaches of FIGS. 9 and 10 is that a storage element is inhibited when (UDL, LDL)=(1, 1).

FIG. 11*a* depicts the use of logical operations based on the data latch values of FIG. 10 and results of an A-state read operation to provide a count of erased state errors and under programmed higher state errors in a failure detection process. FIG. 11*a* repeats the QDL row from the table of FIG. 10. The rows of FIG. 10 are also repeated in FIG. 11*b* for reference. QDL will identify the residual under programmed storage elements at the end of a programming operation. SA<=read@A indicates that a read operation is performed at Vra, and a result of the read operation is loaded into the sense amplifier (SA), e.g., sense module. This read operation distinguishes between storage elements in the erased state and storage elements in an adjacent state (e.g., A-state) of the target data states. The read operation determines if any E-state storage elements have crossed Vra due to a disturb. Under this read, an "E" (non failed E-state) storage element will be conductive while an "Efail" (failed E-state) storage element and all programmed states (e.g., A-, B-, C-state) storage elements will be non conductive.

In this example, SA=0 if the storage element is conductive during the sensing, and SA=1 if the storage element is non-conductive. As depicted, for an "E" storage element, SA=0, and for an "Efail" storage element, SA=1. SA=1 as well for all programmed state storage elements. In the logical operation SA&~QDL, "&" denotes a logical AND, and "~" denotes the negative or inverse. SA&~QDL identifies the storage elements in the "Efail," "Afast," "Bfast" and "Cfast" conditions. At the end of programming, a few of the storage elements which cannot be programmed to their target state and are ignored. The storage elements in the "Afast," "Bfast" and "Cfast" conditions are comprised of these ignored storage elements.

The number of errors for all data states can be determined by counting the "1's" in YBOX after the logic operation YBOX<=~SA|QDL. This count includes the "Efail" storage elements as well as the A-, B- and C-state storage elements which have not yet finished programming (e.g., under "Afast," "Aslow," "Bfast," "Bslow" and "Cfast") and were ignored before programming finishes. These ignored storage elements can also potentially cause errors. Since an error correction code (ECC) can take care of these errors, it can be more meaningful to count the errors of all states together.

FIG. 11*b* depicts the use of logical operations based on the data latch values of FIG. 10 and results of an A-state read operation to provide a count of erased state errors ("Efail") in a failure detection process. In this operation, only "Efail" storage elements are counted and counting of other unfinished A-, B- or C-state storage elements can be avoided. FIG. 11*b* repeats the QDL, UDL and LDL rows from the table of FIG. 10, in addition to the SA row from FIG. 11*a*. In both of the counting methods (all states together or E-state alone), the data in the three data latches QDL, UDL, and LDL will preserve the data for data recovery. Once the failure count exceeds a threshold, a full word line read operation can be performed to recover the data and move it to another location in the memory device.

To count only the "Efail" storage elements, the logical operation YBOX<=SA&~QDL&UDL&LDL can be used. This assigns a value to the temporary variable YBOX. The dashed-line box indicates that YBOX=1 for "Efail" and YBOX=0 for E and all other storage element conditions. Thus, YBOX distinguishes "Efail" storage elements from all other storage elements. The number of "Efail" storage elements can thus be counted by counting the number of storage elements for which YBOX=1, across a set of storage elements in a programming operation.

FIG. 11*c* depicts the use of logical operations based on the data latch values of FIG. 10 and results of C- and B-state read operations in a data recovery process. The steps for the data recovery are as following:

1. QDL recovery—QDL data can be obtained from the remaining data in the three data latches from QDL*<=~(~QDL&UDL&LDL).
2. Read at C-state (Vrc). Since some of the C-state storage elements might not have reached their target state and got ignored during programming, we can assume that some of the C-state data will be read incorrectly (marked by X). The UDL can be updated to recover the C-state by the logic operation UDL*<=SA|(UDL&~LDL).
3. The UDL latch will be updated one more time to recover the upper page data fully using UDL**<=UDL|~QDL.
4. Read at B-state (Vrb). Again, due to the same reason as described above for the C-state, we can assume that some of the B-state data will be read incorrectly (marked by X). Since we have remaining data, the LDL data can be transformed to the original program data by the logical operation LDL<=LDL&~SA.

Here, the C-read is first since the upper page data recovery depends on the remaining data on LDL and QDL.

The dashed-line boxes indicate the final recovered values for UDL and LDL. It can be verified from FIG. 10 or 11*b* that these values are the same as the values which were originally set in the data latches according to the write data. Thus, by performing this data recovery operation, we could recover both lower page and upper page data information for each storage element correctly.

Note that the logical operations can be performed in the managing circuit of the sense block, or in the state machine, both of which hare on the memory chip. This avoids the need to transfer data to an external, off-chip controller (e.g., 150 in FIG. 1) to perform operation there. Thus, the error detection and data recovery operation can be performed on the chip in a manner which is essentially transparent to the off-chip controller or host.

FIG. 12*a* depicts an example programming and post-programming failure detection and recovery operation. At step 1200, a programming operation begins for an upper page of write data. Note that a lower page can be previously programmed. Step 1202 configures data latches associated with sense modules of respective storage elements. The sense modules can be associated with respective bit lines and NAND strings or other chains of series-connected storage elements, for instance. The data latches are configured to identify a first subset of storage elements to be kept in an erased state, and a second subset of storage elements to be programmed to respective target data states, such as A-, B- and C-states. A program loop count is updated at step 1204. Initially, it is set to 0. At step 1206, a program voltage Vpgm is applied to a selected word line, which includes the first and second subsets of storage elements. Also, an inhibit or program mode is set by the sense modules based on the data latches.

At step 1208, a verify operation is performed using offset and target verify levels. This is a sensing operation which can use a sense module to pre-charge a respective bit line and allow a sense node to discharge into the bit line when the respective storage element is in a conductive state. The storage element does not appreciably discharge when the storage element is in a non-conductive state. After a discharge period, resulting data can be transferred to the managing circuit to monitor and control the programming of each storage element. In particular, at step 1210, the managing circuit updates the data latches based on the results from the verify operation, such as discussed in connection with FIG. 10. Step 1212 determines a number of under programmed storage elements. For example, as discussed in connection with FIG. 10, the under programmed A-, B- and C-state storage elements can be counted by performing a logical operation YBOX<=UDL&LDL. Decision step 1214 determines if the number of under programmed storage elements is less than a threshold. If decision step 1214 is true, the programming operation is successful (step 1216), and a post-programming error detection and recovery operation is performed (step 1218), as discussed further in connection with FIGS. 12*b* and 12*c*. Decision step 1214 is true when no more than a maximum number of storage elements in the second subset have failed to reached their respective target data states.

If decision step 1214 is false, decision step 1222 determines if the loop count has exceeded a maximum. If decision step 1222 is true, the programming operation is unsuccessful (step 1224). If decision step 1222 is false, Vpgm is stepped up (step 1220) and the loop count is updated (step 1204) so that another program-verify iteration is performed.

Figure 12B:
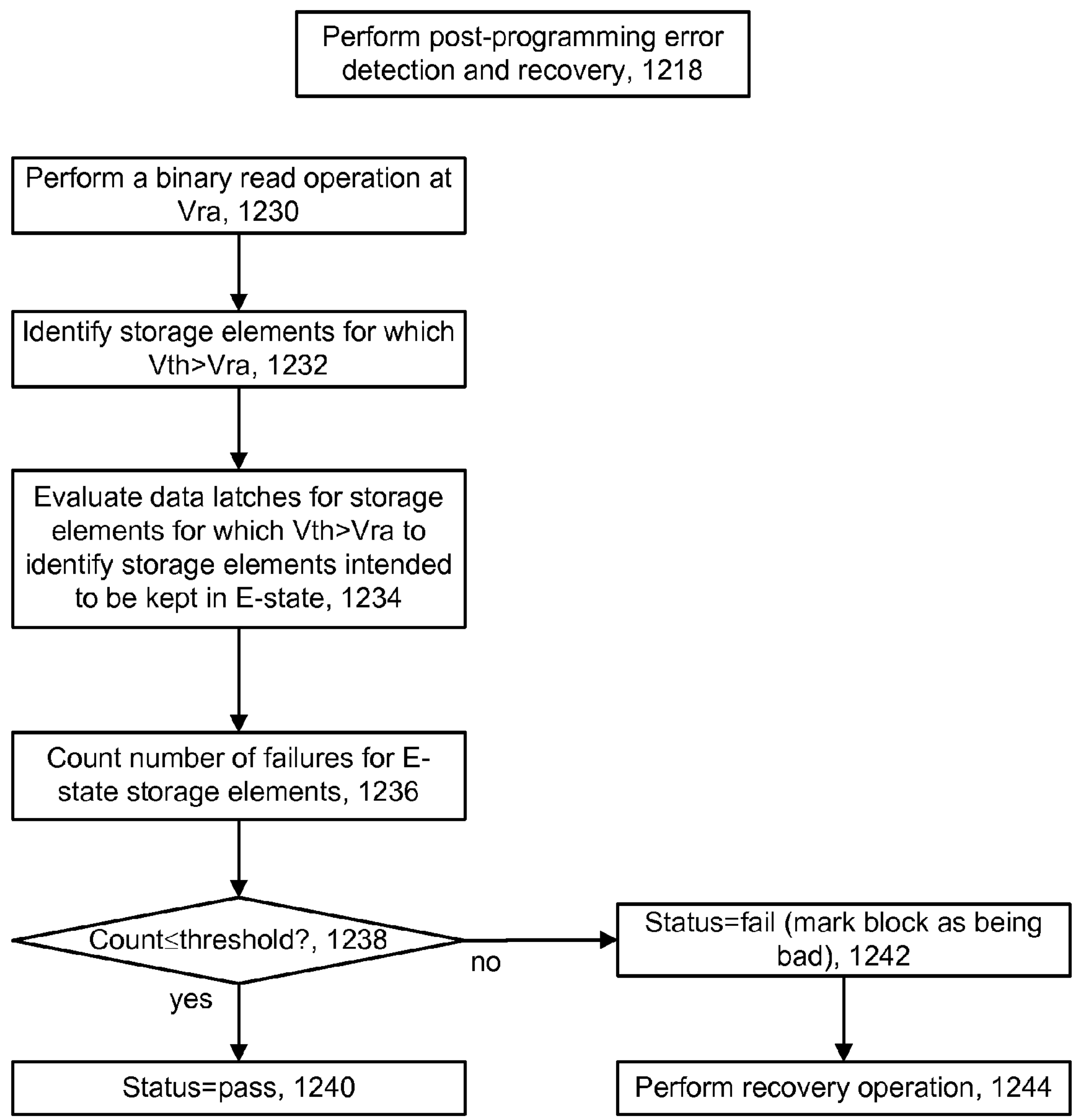
FIG. 12*b* depicts further details of the post-programming error detection and recovery operation of step 1218 of FIG. 12*a*.

FIG. 12*b* depicts further details of the post-programming error detection and recovery operation of step 1218 of FIG. 12*a*. At step 1230, a binary read operation is performed at Vra. See the operation SA<=read@A in FIG. 11*a*. Step 1232 identifies storage elements for which Vth>Vra (e.g., from SA=1). Step 1234 evaluates the data latches for the storage elements for which Vth>Vra to identify storage elements ("Efails") which were intended to be kept in the E-state according to the write data. Step 1234 can perform the operation YBOX<=SA&~QDL&UDL&LDL discussed in connection with FIG. 11*b*. Step 1236 counts the number of failures for E-state storage elements, e.g., from the storage elements for which YBOX=1.

At decision step 1238, if the count is less than or equal to a threshold, a status=pass is set at step 1240. This indicates, e.g., that a small, ECC-correctable number of errors were detected, which does not warrant re-writing the data to another location. If decision step 1238 is false, a status=fail is set. The block in which the errors are detected may be marked as being bad so that it is no longer used. Moreover, a recover operation is performed at step 1244, as discussed further in connection with FIG. 12*c*.

Figure 12C:
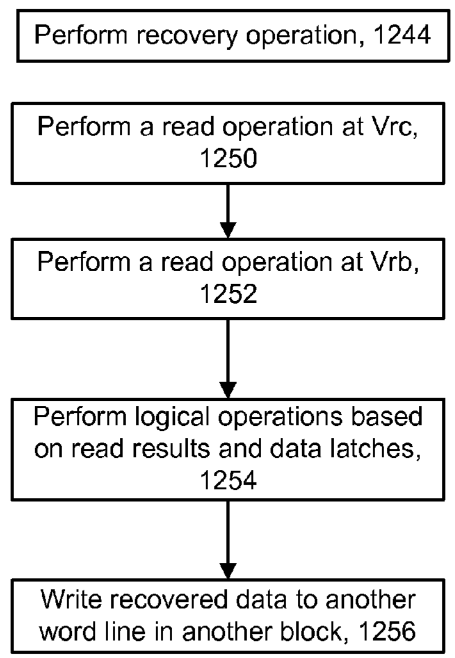
FIG. 12*c* depicts further details of the data recovery operation of step 1244 of FIG. 12*b*.

FIG. 12*c* depicts further details of the data recovery operation of step 1244 of FIG. 12*b*. Step 1250 performs a read operation at Vrc (SA<=read@C in FIG. 11*c*), step 1252 performs a read operation at Vrb (SA<=read@B in FIG. 11*c*), and step 1254 performs logical operations based on the read results and values in the data latches, also as described in connection with FIG. 11*c*. Step 1256 writes the recovered data to another word line in another block.

FIG. 13 depicts an example waveform of a selected word line in a programming operation and subsequent data recovery process. A programming operation can include a series of program-verify iterations in which a program pulse (e.g., 1302, 1304, 1306, . . . , 1308) is applied to a selected word line followed by verify voltages (e.g., 1310) at VvaL, Vva, VvbL, Vvb and Vvc. The programming operation extends in a time period 1312, from a start time is to a final, end time tf. A read operation at Vra occurs at to in an error detection process. Based on a result of the error detection process, a data recovery operation may be initiated which uses a C-state read at Vrc at tc and a B-state read at Vrb at tb.

Various alternatives of the error detection and recovery process can be provided:

1. In the described scheme, we use a (0, 1, 1) configuration for the data latches for the E-state storage elements to distinguish them from the inhibited A/B/C-state storage elements, which use a (1, 1, 1) configuration. An alternative is an opposite approach which uses (0, 1, 1) for the inhibited A/B/C-state storage elements, and (1, 1, 1) for the E-state storage elements.

2. In the described scheme, a unique (0, 1, 1) data latch configuration is used for an E-state storage element to distinguish it from any other storage element at the end of a programming operation. But, in general, the (0, 1, 1) configuration can instead be assigned to any one of inhibited A/B/C-state storage elements and thus storage elements of that state can be distinguishable at the end of a programming operation. For example, (0, 1, 1) can be assigned to an inhibited A-state state storage element so that, at the end of programming, programmed A-state storage elements can be distinguished from other storage elements. Depending on which option is chosen, it is guaranteed that correct data will be recovered for the storage elements corresponding to that state. This can be useful in situations where only one of the state's data is corrupted. For example, in some specific scenarios, storage element have trouble being programmed to the C-state, causing the page to fail program status, while data on all other states looks normal. In such a scenario, we can recover the complete data by ascertaining the C-state storage elements from QDL data and other states by using A-read, B-read and C-read. One could also provide a ROM fuse option to choose which state is to be associated with this data-recovery scheme.

3. As described, there are two data latch combinations that are unused: (0, 1, 1) and (1, 1, 0). It is possible that we could use both combinations together to represent two different kind of storage elements. For example, the (0,1,1) configuration can be used to represent an E-state storage element while the (1,1,0) configuration can be used for inhibited C-state storage elements. In this case, a full data recovery can be guaranteed for at least these two data states.

Note that it was discussed above in connection with FIG. 9 that two of the combinations of (QDL, UDL, LDL) are typically unused: namely #1 (0, 1, 1) and #2 (1, 1, 0). In the detailed example provide, the combination #1 by itself was used. However, it is also possible to use both combinations #1 and #2, e.g., to recover from two kinds of failures. For example, combination #1 can be assigned to E-state failures, and combination #2 can be assigned to A-state failures (e.g., Ainh) In this case, we can recover E→X as well as A→X fails. As another alternative, combination #2 could be used instead of combination #1, depending on the other latch assignments.

In one embodiment, a method for programming a set of storage elements in a non-volatile storage system includes, based on write data, configuring data in data latches associated with storage elements in a first subset of the set which are to be kept in an erased state, and in data latches associated with storage elements in a second subset of the set which are to be programmed to respective target data states. The method further includes inhibiting the storage elements in the first subset while programming the storage elements in the second subset, and updating the associated data latches of the storage elements in the second subset based on a progress of the storage elements in the second subset during the programming. The method further includes determining that no more than a maximum number of storage elements in the second subset have failed to reached their respective target data states (which correlates to having no more than a specified number of bit or storage element errors), so that the programming of the storage elements in the second subset is considered to be successfully completed. The method further includes, responsive to the successful completion of the programming of the storage elements in the second subset, determining a number of storage elements in the first subset which have an error by performing a read operation for the storage elements in the first subset which distinguishes between the erased state and an adjacent state of the target data states.

In another embodiment, a non-volatile storage system includes a set of non-volatile storage elements, including storage elements in a first subset of the set which are to be kept in an erased state, and storage elements of a second subset of the set which are to be programmed to respective target data states. Also provided are data latches associated with each storage element, and at least one control circuit. The at least one control circuit: (a) based on write data, configures data in the data latches associated with the storage elements in the first subset, and in the data latches associated with the storage elements in the second subset, (b) inhibits the storage elements in the first subset, programs the storage elements in the second subset, and updates the associated data latches of the storage elements in the second subset based on a progress of the storage elements in the second subset when programmed, (c) determines that no more than a maximum number of the storage elements in the second subset have failed to reach their respective target data states, so that the programming of the storage elements in the second subset is considered to be successfully completed, and (d) responsive to the successful completion of the programming of the storage elements in the second subset, determine a number of storage elements in the first subset which have an error by performing a read operation for the storage elements in the first subset which distinguishes between the erased state first and an adjacent state of the target data states.

In another embodiment, a non-volatile storage system includes means for, based on write data, configuring data in data latches associated with storage elements in a first subset of the set which are to be kept in an erased state, and in data latches associated with storage elements in a second subset of the set which are to be programmed to respective target data states. Also provided are means for inhibiting the storage elements in the first subset while programming the storage elements in the second subset, and updating the associated data latches of the storage elements in the second subset based on a progress of the storage elements in the second subset during the programming. Also provided are means for determining that no more than a maximum number of storage elements in the second subset have failed to reached their respective target data states, so that the programming of the storage elements in the second subset is considered to be successfully completed. Also provided are means for, responsive to the successful completion of the programming of the storage elements in the second subset, determining a number of storage elements in the first subset which have an error by performing a read operation for the storage elements in the first subset which distinguishes between the erased state and an adjacent state of the target data states.

In another embodiment, a method for programming a set in a non-volatile storage system includes, based on write data, configuring data in data latches associated with the storage elements, the write data identifies different target data states to which at least some of the storage elements are intended to be programmed. The method further includes performing a programming operation to program the at least some of the storage elements to the different target data states, and updating the associated data latches of the at least some of the storage elements based on a progress of the at least some of the storage elements during the programming operation. The method further includes, responsive to successful completion of the programming operation, performing a read operation which distinguishes storage elements which are in one target data state (e.g, the E state) of the different target data states from storage elements which are in other target data states (e.g, A, B and C states) of the different target data states. The method further includes determining a number of errored storage elements by determining a number of storage elements which are intended to be programmed to the one target data state, from among the storage elements which are in the other target data states. The method further includes, if the number of errored storage elements is sufficiently high, performing a recovery operation to recover the write data.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of storage elements in a non-volatile storage system, the method comprising:

providing write data in data latches associated with storage elements in a first subset of the set which are to be kept in an erased state, and write data in data latches associated with storage elements in a second subset of the set which are to be programmed to respective target data states;

in a programming operation, programming the storage elements in the second subset;

updating the write data of the data latches associated with the storage elements in the second subset based on a progress of the storage elements in the second subset during the programming, thereby providing a same updated write data for storage elements in the second subset which reach their respective target data states;

determining that no more than a maximum number of the storage elements in the second subset have failed to reached their respective target data states, so that the programming of the storage elements in the second subset is considered to be successfully completed; and responsive to the successful completion of the programming of the storage elements in the second subset, identifying the storage elements in the first subset based on the write data in the data latches associated with storage elements in the first subset, the write data in the data latches associated with the storage elements in the first subset is distinguishable from the same updated write data for the storage elements in the second subset which reach their respective target data states, and determining a number of the storage elements in the first subset which have an error by performing a read operation for the storage elements in the first subset which distinguishes between the erased state and an adjacent state of the respective target data states.

2. The method of claim 1, further comprising:

if the number of the storage elements in the first subset which have the error exceeds a threshold of correctable errors, performing a recovery operation to recover the write data associated with the storage elements in the second subset, the recovery operation performs additional read operations for the storage elements in the second subset which distinguish between each of the respective target data states; and if the number of the storage elements in the first subset which have the error does not exceed the threshold of correctable errors, setting a pass status for the programming operation without performing the recovery operation.

3. The method of claim 2, wherein:

the respective target data states comprise a first target data state (A) which is the adjacent state, a second target data state (B) adjacent to the first target data state, and a third target data state (C) adjacent to the second target data state; and the additional read operations distinguish between the second and third target data states, and between the first and second target data states.

4. The method of claim 1, wherein:

each storage element in the second subset which has successfully completed programming had a first bit value in one of its associated data latches;

each storage element in the first subset is identified by a bit value which is different than the first bit value in one of its associated data latches; and the determining the number of the storage elements in the first subset which have the error comprises performing a logical operation using the one of the associated data latches of each storage element in the first subset and results from the read operation.

5. The method of claim 1, wherein:

the data latches comprise first, second and third data latches associated with each storage element;

the programming comprises verifying at least some of the storage elements in the second subset against an offset verify level and a target verify level, for one of the respective target data states, the at least some of the storage elements in the second subset are programmed in a fast programming mode when respective threshold voltages are below the offset verify level, and in a slow programming mode when the respective threshold voltages exceed the offset verify level but are below the target verify level;

for each of the storage elements in the second subset which are verified against the offset verify level and the target verify level for the one of the respective target data states, the first data latch indicates whether the storage element has reached the offset verify level, the second data latch provides upper page data, and the third data latch provides lower page data; and for each of the storage elements in the first subset, the first data latch has a value which is different than a value in the first data latches of the storage elements in the second subset which have successfully completed programming.

6. The method of claim 1, wherein:

the determining that no more than the maximum number of the storage elements in the second subset have failed to reach their respective target data states comprises performing logical operations using the data latches for each of the storage elements in the second subset.

7. The method of claim 1, wherein:

the determining the number of the storage elements in the first subset which have the error comprises determining a number of the storage elements in the first subset which are read as being in one of the respective target data states.

8. The method of claim 1, wherein:

the storage elements in the second subset are programmed with at least two pages of data.

9. A non-volatile storage system, comprising:

a set of non-volatile storage elements, comprising storage elements in a first subset of the set which are to be kept in an erased state, and storage elements of a second subset of the set which are to be programmed to respective target data states;

data latches associated with each storage element; and a control circuit, the control circuit: provides write data in the data latches associated with the storage elements in the first subset, and write data in the data latches associated with the storage elements in the second subset, in connection with a programming operation, performs programming of the storage elements in the second subset, and updates the write data of the data latches associated with the storage elements in the second subset based on a progress of the storage elements in the second subset in the programming, determines that no more than a maximum number of the storage elements in the second subset have failed to reach their respective target data states, so that the programming of the storage elements in the second subset is considered to be successfully completed, responsive to the successful completion of the programming of the storage elements in the second subset, determines a number of the storage elements in the first subset which have an error by performance of a read operation for the storage elements in the first subset which distinguishes between the erased state and an adjacent state of the target data states, if the number of the storage elements in the first subset which have the error exceeds a threshold of correctable errors, performs a recovery operation to recover the write data associated with the storage elements in the second subset, the recovery operation performs additional read operations for the storage elements in the second subset which distinguish between each target data state, and if the number of the storage elements in the first subset which have the error does not exceed the threshold of correctable errors, sets a pass status for the programming operation without performance of the recovery operation.

10. The non-volatile storage system of claim 9, wherein:

each storage element in the second subset which has successfully completed programming has a first value in one of its associated data latches;

each of the storage elements in the first subset is identified by a value which is different than the first value in one of its associated data latches; and the control circuit, to identify the storage elements in the first subset, performs logical operations using the one of the associated data latches of each storage element in the first subset and results from the read operation.

11. The non-volatile storage system of claim 9, wherein:

the data latches comprise first, second and third data latches associated with each storage element;

to program the storage elements in the second subset, the control circuit verifies at least some of the storage elements in the second subset against an offset verify level and a target verify level for one of the respective target data states, the at least some of the storage elements in the second subset are programmed in a fast programming mode when respective threshold voltages are below the offset verify level, and in a slow programming mode when the respective threshold voltages exceed the offset verify level but are below the target verify level;

for each of the storage elements in the second subset which are verified against the offset verify level and the target verify level for the one of the respective target data states, the first data latch indicates whether the storage element has reached the offset verify level, the second data latch provides upper page data, and the third data latch provides lower page data; and for each of the storage elements in the first subset, the first data latch has a value which is different than a value in the first data latches of the storage elements in the second subset which have successfully completed programming.

12. The non-volatile storage system of claim 9, wherein:

the control circuit performs logical operations using the data latches for each of the storage elements in the second subset to verify that no more than the maximum number of the storage elements in the second subset have failed to reach their respective target data states.

13. The non-volatile storage system of claim 9, wherein:

the control circuit, to determine the number of the storage elements in the first subset which have the error, determines a number of the storage elements in the first subset which are read as being in one of the respective target data states.

14. A method for programming a set of storage elements in a non-volatile storage system, the method comprising:

providing write data in data latches associated with the storage elements, the write data identifies different target data states to which at least some of the storage elements are intended to be programmed;

in a programming operation, programming the at least some of the storage elements to the different target data states, and updating the write data of associated data latches of the at least some of the storage elements based on a progress of the at least some of the storage elements during the programming operation;

responsive to successful completion of the programming of the at least some of the storage elements to the different target data states, performing a read operation which distinguishes storage elements which are in one target data state of the different target data states from storage elements which are in other target data states of the different target data states, the one target data state has a lower target verify level than target verify levels of the other target data states;

determining a number of errored storage elements among storage elements in the set of storage elements which are intended to be programmed to the one target data state;

if the number of errored storage elements which are intended to be programmed to the one target data state is above a threshold of correctable errors, performing a recovery operation to recover the write data; and if the number of errored storage elements which are intended to be programmed to the one target data state is not above the threshold of correctable errors, setting a pass status for the programming operation without performing the recovery operation.

15. The method of claim 14, wherein:

the recovery operation performs additional read operations for the at least some of the storage elements which distinguish between each of the different target data states;

the different target data states to which the at least some of the storage elements are to be programmed comprise at least three target data states.

16. The method of claim 14, wherein:

each storage element which has successfully completed programming has a first value in one of its associated data latches; and each storage element which is intended to be programmed to the one target data state is identified by a value which is different than the first value in one of its associated data latches so that each storage element which is intended to be programmed to the one target data state can be distinguished from the storage elements which are intended to be programmed to the other target data states by evaluating the one of the associated data latches.

17. The method of claim 14, wherein:

the at least some of the storage elements comprise storage elements which are verified against an offset verify level and a target verify level for one of the different target data states, the storage elements which are verified against the offset verify level and the target verify level for the one of the different target data states are programmed in a fast programming mode when respective threshold voltages are below the offset verify level, and in a slow programming mode when the respective threshold voltages exceed the offset verify level but are below the target verify level;

the data latches associated with each storage element include first, second and third data latches;

for each of the storage elements which are verified against the offset verify level and the target verify level for the one of the different target data states, the first data latch indicates whether the storage element has passed a verification test at the offset verify level, the second data latch provides upper page data, and the third data latch provides lower page data; and for each of the storage elements which are intended to be programmed to the one target data state, the first data latch has a value which is different than a value in the first data latches of the storage elements which have successfully completed programming, so that the storage elements which are intended to be programmed to the one target data state can be identified using their first data latches.

18. The method of claim 1, wherein:

bit lines are associated with the storage elements in the set, and bit line latches, different than the data latches, are associated with the bit lines; and the method further comprises setting voltages on the bit lines based on states latched in the bit line latches.

19. The non-volatile storage system of claim 9, wherein:

the update of the write data of the data latches associated with the storage elements in the second subset provides a same updated write data for storage elements in the second subset which reach their respective target data states; and the control circuit, to determine the number of the storage elements in the first subset which have the error, identifies the storage elements in the first subset based on the write data in the data latches associated with storage elements in the first subset, the write data in the data latches associated with the storage elements in the first subset is distinguishable from the same updated write data.

20. The method of claim 14, wherein:

the updating the write data provides a same updated write data for the storage elements which reach the other target data states; and the determining the number of errored storage elements which are intended to be programmed to the one target data state comprises identifying the storage elements which are intended to be programmed to the one target data state based on the write data in the data latches associated with the storage elements which are intended to be programmed to the one target data state, the write data in the data latches associated with the storage elements which are intended to be programmed to the one target data state is distinguishable from the same updated write data.

* * * * *